(12) United States Patent
Tobita (10) Patent No.: US 6,808,798 B2
(45) Date of Patent: Oct. 26, 2004

(54) HEAT CONDUCTIVE RESIN SUBSTRATE AND SEMICONDUCTOR PACKAGE

(75) Inventor: Masayuki Tobita, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 125 days.

(21) Appl. No.: 10/125,734

(22) Filed: Apr. 18, 2002

(65) Prior Publication Data

US 2003/0003287 A1 Jan. 2, 2003

Related U.S. Application Data

(62) Division of application No. 09/532,974, filed on Mar. 22, 2000, now Pat. No. 6,451,418.

(51) Int. Cl.[7] ............................................... B32B 27/12
(52) U.S. Cl. .................... 428/298.1; 428/901; 428/359; 428/364; 428/374; 174/250; 174/102 SC; 257/613; 257/684; 361/704; 361/719
(58) Field of Search ............................... 428/298.1, 901, 428/359, 364, 374; 174/250, 102 SC; 257/613, 684; 361/704, 719

(56) References Cited

U.S. PATENT DOCUMENTS 4,837,407 A * 6/1989 Nezu ........................... 174/258
6,261,481 B1 * 7/2001 Akatsuka et al. ........... 252/567

* cited by examiner

Primary Examiner—Merrick Dixon
(74) Attorney, Agent, or Firm—McGlew and Tuttle, P.C.

(57) ABSTRACT

This invention relates to a heat conductive resin substrate which polybenzasol fibers are oriented in a thick direction and/or a direction of a surface of a resin substrate, further to the heat conductive resin substrate and a semiconductor package excellent in heat radiation ability which the semiconductor chips are mounted on the heat conductive resin substrate which the polybenzasol fibers are oriented in the thick direction (the Z direction) and/or the direction of the surface of the resin substrate, the heat conductive resin substance and the semiconductor package being provided with electrical insulation and high thermal conductivity, and being capable of controlling the thermal expansion coefficient.

5 Claims, 6 Drawing Sheets

HEAT CONDUCTIVE RESIN SUBSTRATE AND SEMICONDUCTOR PACKAGE

This is a Divisional of application Ser. No. 09/532,974 filed Mar. 22, 2000 now U.S. Pat. No. 6,451,418, and the entire disclosure of this prior application is considered to be part of the disclosure of the accompanying application and is hereby incorporated by reference therein.

BACKGROUND OF THE INVENTION

The present invention relates to a heat conductive resin substrate dissipating heat generated from electronic equipments and a semiconductor package excellent in heat radiation ability.

Recently, a countermeasure of heat generated from the electronic equipment due to advance in integration of the semiconductor package and advance in high integration and speed up of LSI or the like accompanying with advance in performance, miniaturization and weight reduction in the electronic equipment has became to be very important problems.

Conventionally, a method using a printed circuit board made of metal or ceramic with high heat conductivity, a method forming thermal via-holes for dissipating heat in a substrate, a method using metal, ceramic or resin with high heat conductivity as semiconductor-packaging material, or a method interposing grease with high thermal conductivity or a heat conductive rubber with flexibility between a heat-generating source and a radiator or between a heat source and a heat-conducting plate for purpose of reduction in contact thermal resistance or the like have been practiced in order for diffusion of heat by heat-generating element.

Although a known resin substrate, that is, the glass-cloth epoxy resin substrate or the like used in the printed circuit board on which electronic components such as the semiconductor package are equipped is relatively excellent in mechanical property, dimension accuracy, workability of a through-hole and multi-layering as compared with the metal substrate or the ceramic substrate, there is a disadvantage of inferiority in heat conductivity.

Therefore, it has been considered a method filling electrical insulation fillers such as metal oxides, metal nitrides, metal hydroxides and such as an aluminum oxide, a boron nitride, an aluminum nitride, a magnesium oxide, a zinc oxide, a silicon carbide, quartz and an aluminum hydroxide with high thermal conductivity into resin for a resin substrate which high heat conductivity is required.

However, thermal conductivity of the resin substrate into which such heat conductive fillers are filled is to the extent of 3 W/mK at most, therefore, advance in thermal conductivity has been desired earnestly.

According to Japanese Patent Laid-open No.HEI9-255871, a thermoplastic resin composition containing a polybenzasol fiber and the moldings is proposed.

This invention relates to the moldings such as a rigid resin composition, substrate material and case material with impact resistance, toughness, electrical insulation and heat conductivity. However, an upper limit of thermal conductivity of the substrate material obtained by this resin composition is approximately 1 W/mK, whereby heat conductive substrate material and the heat radiation semiconductor package of an object of the invention have not been obtained.

On the one hand, Japanese Patent Laid-open No.HEI11-17369 relates to heat radiation material consisting of a synthetic-resin wire rod with a certain diameter, which organic fibers are blended into a synthetic resin in the longitudinal direction. This heat radiation material is one which the synthetic-resin wire rods consisting of protrusion rods of 5 mm in diameter and 4 mm in length is blended, whereby the heat conductive substrate material and the semiconductor package excellent in heat radiation, of the object of the invention can not be obtained.

Moreover, for the electronic components constituted by a plurality of different materials such as semi-conductive silicon, an alloy of a copper and iron system, aluminum, a solder, a silicon oxide, a nitride, a resin substrate and an adhesive, a countermeasure for malfunctions by a generating thermal stress becomes important because of difference in the thermal expansion coefficients of respective constituting materials. That is, when the thermal expansion coefficient of the resin substrate becomes possible, thermal and electrical reliability is improved, thereby being able to contribute for the industry.

SUMMARY OF THE INVENTION

This invention provides a heat conductive substrate which is provided with electrical insulation and high heat conductivity, and is able to control a thermal expansion coefficient, a semiconductor package being excellent in heat radiation ability.

As a result of earnest studying for solving these problems, it has been found that the heat conductive resin substrate which the polybenzasol fibers are arranged in the thick direction and/or in the direction of a surface of the resin substrate, is provided with electrical insulation, and high heat conductivity and the thermal expansion coefficient can be controlled, and this invention is put into practice.

That is, this invention relates to a heat conductive resin substrate wherein the polybenzasol fibers are oriented in the thick direction and/or in the direction of a surface of the resin substrate, and further, a semiconductor package wherein semiconductor chips are mounted on the heat conductive resin substrate which the polybenzasol fibers are oriented in the thick direction and/or in the direction of a surface of the resin substrate.

The polybenzasol fiber used in the heat conductive resin substrate and the semiconductor package according to the invention is a fiber constituted of polybenzasol fiber polymer, and apolybenzasol (PBZ) means polybenzooxasol homopolymer (PBO), polybenzothiasol homopolymer (PBT) and random copolymer, sequential copolymer, block copolymer or graphed copolymer of those PBO and PBT, and is an organic polymer fiber excellent in strength, modulus of elasticity, heat resistance and electrical insulation.

Although a diameter, a shape of the cross section and a length of the polybenzasol fibers are not specified, the length of the fiber is preferable the same length as that of the resin substrate for heat transmission. The reason is that a length is same or the near to the same is the length, the larger becomes the thermal conductivity and a thermal expansion coefficient becomes lower. Moreover, for tensile strength of the polybenzasol fiber, it is preferable 4 G Pa or more and an initial modulus of elasticity for tension is 140 G Pa or more. The heat conductive resin substrate and the semiconductor package according to the invention can show more excellent heat conductivity by arranging in the resin substrate using the polybenzasol fiber which the tensile strength and the initial modulus of elasticity for tension are present within the range thereof.

The heat conductive resin substrate according to the invention comprises a structure that the polybenzasol fibers are oriented in the thick direction and/or in the direction of a surface of the resin substrate. The heat conductivity of the longitudinal direction of the fiber arranged is improved by orienting the polybenzasol fibers in the thick direction and/or in the direction of a surface of the substrate. Moreover, heat conductivity in the any direction which respective polybenzasol fibers are oriented has become possible to increase, as well as the thermal expansion coefficients has become possible to control, by orienting the polybenzasol fibers not only in one direction of the thick direction (hereinafter defined this as a Z direction) or the direction of a surface (hereinafter defined this as a X direction or a Y direction), but also a plurality of directions such as in two directions of the surface, in two directions of the thick direction and one direction within the surface (the Z direction and the X direction), in three directions of the thick direction and two directions within the surface (the Z direction and the X direction and the Y direction), and in three directions or more of the thick direction and two directions or more within the surface (the Z direction and the X direction, the Y direction and an another direction within X Y surface).

The concentration of the polybenzasol fiber allowing to contain in the heat conductive resin substrate is preferably 2 to 80 in volume percent. Improvement in heat conductivity becomes less, and the controlled range of the thermal expansion coefficient also becomes narrow when being less than 2 in volume percent. Workability and easiness of processing become very poor and is not avoided from intrusion of air bubbles when 80 volume percent is exceeded, thereby being not appropriate. The further preferable addition amount of the polybenzasol fiber is 20 to 70 in volume percent, and the yet further preferable addition amount is 40 to 60 in volume percent. Heat conductivity in at least one direction becomes 4 W/mK or more, and this range is preferable.

Moreover, as a fiber except for the polybenzasol fiber, a small quantity of an organic fiber, a natural fiber, a carbon fiber, a metal fiber such as a glass fiber, an alamido fiber, a polyester fiber, a aliphatic polyamide fiber, a vinyl on fiber and a polyethylene fiber, further short fiber and long fiber consisting of composite material which these fibers are compounded, or a small quantity of those woven fabric and non-woven fabric can be mixed.

A kind of resin used in the heat conductive resin substrate according to the invention can not be limited in particular. A thermoplastic resin, thermoplastic elastomer, a thermosetting resin and a cross-linked rubber can be selected in response to the required performance such as hardness, mechanical strength, heat resistance, electrical characteristics, durability and reliability of the heat conductive resin substrate of the object.

As the thermoplastic resin and thermoplastic elastomer, the following can be given: ethylene-α-olefine copolymer such as polyethylene, polypropylene, ethylene-propylene copolymer, a fluoro resin such as polymethyle pentene, polyvinyl chloride, polyvinylidene chloride, polyvinyl acetate, ethylene-vinyl acetate copolymer, polyvinyl alcohol, polyvinyl acetal, polyvinylidene fluoride, and polytetrafluoroethylene;

polyethylene terephthalate, polybutylene terephthalate, polyethylene naphthalate, polystyrene, polyacrylonitrile, styrene-acrylonitrile copolymer, ABS resin, polyphenylene ether and a modified PPE resin, a kind of aliphatic and aromatic polyamide, polyimide, polyamideimide, a kind of polymethacrylic acid ester such as polymethacrylic acid and its methylester;

A thermoplastic resins such as a kind of polyacrylic acid, polycarbonate, polyphenylene sulfide, polysulfone, polyether sulfone, polyether nitrile, polyether ketone, polyketone, liquid crystal polymer, silicone resin, ionomer;

Thermoplastic elastomer such as styrene-butadiene or styrene-isoprene block copolymer and its hydropolymer and styrene system thermoplastic resin elastomer, olefine system thermoplastic elastomer, vinyl chloride system thermoplastic elastomer, polyester system thermoplastic elastomer, polyurethane system thermoplastic elastomer, polyamide system thermoplastic elastomer, or the like.

As the thermosetting resin and the cross-linked rubber, the following can be given: the cross-linked rubber such as an epoxy resin, a polyimide resin, a bismaleimide resin, a benzocyclobutene resin, a phenol resin, an unsaturate polyester resin, a diallyl phthalate resin, a silicone resin, an urethane resin, a thermosetting type polyphenylene ether and modified PPE resin, a natural rubber, a butadiene rubber, an isoprene rubber, a styrene-butadiene copolymerizated rubber, a nitrile rubber, adydronitrile rubber, a chloroprene rubber, an ethylene-propylene rubber, a chlorinated polyethylene, a chlorosulfonated polyethyene, a butyl rubber and a halogenated butyl rubber, a fluororubber, an urethane rubber, a silicone rubber, or the like.

Above all, it is preferable to use at least one kind which is selected from the well-known material; an epoxy resin, a polyimide resin, a bismaleimide resin, a benzocyclobutene resin, a silicone resin, a fluoro resin, a polyphenylene ether resin used as the conventional glass-cloth-mixed resin substrate. For a substance which a dielectric constant and dielectric loss tangent are small and an excellent frequency characteristic in a high-frequency region is required, the fluoro resin, the thermosetting type polyphenylene ether resin, the modified PPE resin, or the polyolefine system resin may be preferably used. Furthermore, used of a polymer alloy consisting of a plurality of resins selected from these resins also is not interfered. Moreover, a cross-link method is not limited to the thermosetting property, but a resin according to the well-known cross-link methods such as a light-setting property and wet-setting properly can be used.

Use in combination with a pre-preg which the conventional glass-cloth base material further is impregnated in the heat conductive resin substrate according to the invention and as other heat conductive filler, use in combination with a metal oxide, a metal nitride, a metal carbide, a metal hydroxide such as a aluminum oxide, a boron nitride, an aluminum nitride, a zinc oxide, a silicon carbide, quartz, an aluminum hydroxide whose thermal conductivity is large and a small quantity of a spherical shape, powdered, fiber-like, needle-like, scale-like or whiskers-like filler consisting of a metal or an alloy such as silver, copper, gold, tin, iron, aluminum, magnesium or carbon, also are not interfered. However, it also is significant feature that the heat conductive resin substrate according to the invention has electrical insulation as far as a conductive additive is not blended, the addition amount should be determine in consideration of the presence or absence of requirements of electrical insulation in usage to be used in the case of blending the conductive filler such as metal and carbon auxiliary subsidiarily.

Since the heat conductive resin substrate according to the invention is excellent in control ability of electrical insulation, high heat conductivity and the thermal expansion coefficient, the substrate can be applied in a radiator, a cooler, a heat sink, a heat spreader, a die pad and a casing or the like which heat radiation ability is required. Moreover, the substrate is applicable for material for the rigid or flexible printed circuit board and material for an insulating substrate of the semiconductor package. In the case of application for the printed circuit board, a subtractive method laminating copper films to process, various additive methods and the well-known method for manufacturing the printed circuit board such as a single layer and one side, a single layer and a double-sided, a multi-layer and a build-up printed circuit boards are applicable.

The semiconductor package according to the invention which semiconductor chips are mounted on the heat conductive resin substrate which the polybenzasol fibers are oriented in the thick direction and/or in the direction of a surface of the resin substrate is effective for the usage requiring heat radiation characteristic which becomes important accompanying with advances in performance, advances in function, advances in high integration, miniaturization and weight reduction. As kinds of the specified structure of the semiconductor package, there are various CSP (a chip-sized package), BGA (a ball-grid array package), QFP (quad flat package) and SOP (a small outline package) or the like, and they are not limited specifically. The substrate can be also utilized as an insulating substrate for MCM (multi-chip module).

BRIEF DESCRIPTION OF THE INVENTION

DETAILED DESCRIPTION OF THE PREFERRED EMBODIMENTS

The heat conductive resin substrate according to the invention can be manufactured by impregnating a resin into the polybenzasol fibers oriented in the thick direction and/or in the direction of a surface of the resin substrate to solidify. The polybenzasol fiber is obtained using long fibers themselves and woven-fabric like one justified in one direction, two directions or three directions to arrange in a board-like mold, and by impregnating a matrix resin such as a liquid state epoxy resin and a beozocyclobutene resin to cure. For the woven-fabric like one of the polyester fiber, all one in the form which are designated as a filament woven fabric, a spun yarn-wovel fabric, a staple fiber, a woven fabric, a non-woven fabric, a cloth, a paper yarn, a felt, a pulp, a paper, a crim, a chopped fiber or the like can be used.

Moreover, it is possible to obtain by heating compressing and hardening so-called prepregs oriented the commercially available polybenzasol long fibers in one direction, two directions or more in the resin in a manner to overlap each other in one or a plurality of sheets. Furthermore, it can be manufactured by slice-processing such that the polybenzasol fibers are oriented in the any direction of the thick direction and/or in the direction of a surface of the substrate, after heating and press-forming a block-like cured body in a manner to overlap these prepregs each other.

It is preferable to perform degreasing and cleaning processing of the surface of the polybenzasol fiber in advance, and to give an activation treatment such as an ultraviolet treatment, a corona treatment, a plasma treatment, flame treatment, in order to improve wetability and an adhesive ability of the polybenzasol fiber with the matrix resin. Furthermore, advance in strength and advance in thermal conductivity of the resin substrate which a large quantity of the polybenzasol fibers are oriented can be achieved by processing with the conventional an aluminum system after these surface treatments. Moreover, when forming process on the substrate, air bubbles in the resin and an interface between the fiber resins can be removed by pressurizing or reducing pressure to cure the resin.

This invention will be described in more detail in accordance with embodiments shown in the drawings hereinafter.

Embodiment 1

A block-like molded body was obtained by laminating in a manner to justify fiber directions of a prepreg made of an epoxy resin (material Zylon UD; made by Shinnittetu Kagaku Co., Ltd.) Which the polybenzasol fibers were impregnated 58 in volume percent to heat and press-form.

Figure 1:
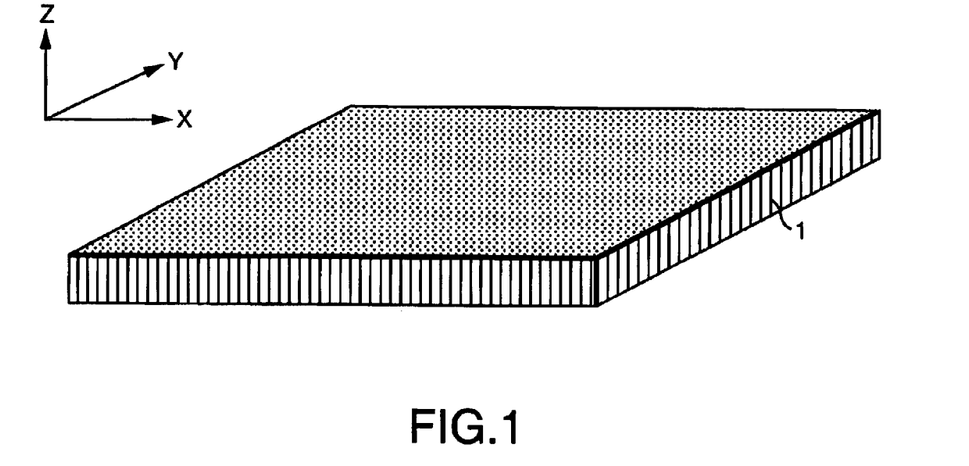
FIG. 1 is a schematic representation showing an example of a heat conductive resin substrate which a polybenzasol fibers are arranged in a thick direction (a Z direction) according to the invention.

A heat conductive resin substrate was prepared by cutting the block-like molded body into 2 mm in thickness using an abrasive-type water jet cutting machine, in said heat conductive resin substrate, and by orienting the polybenzasol fibers in a thick direction (Z direction) as shown in FIG. 1.

The volume resistivity, thermal conductivity, and a thermal expansion coefficient (a coefficient of linear expansion) in each direction of the obtained heat conductive resin substrate were measured to show the result in Table 1.

Embodiment 2

Figure 2:
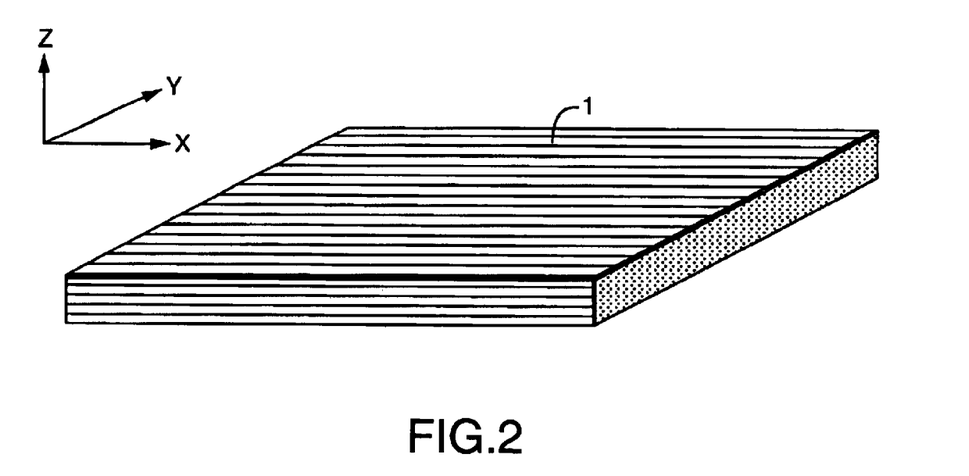
FIG. 2 is a schematic representation showing an example of a heat conductive resin substrate which a polybenzasol fibers are arranged in a direction inside the surface (X direction) according to the invention.
Figure 3:
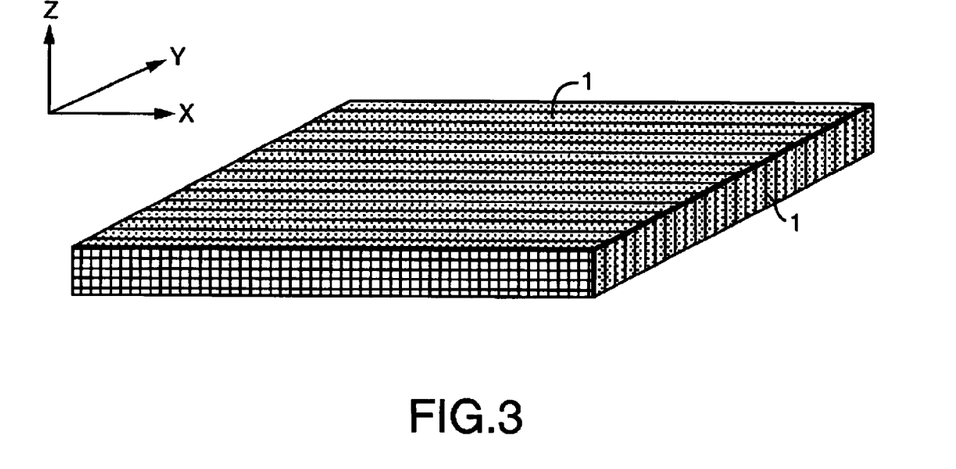
FIG. 3 is a schematic representation showing an example of a heat conductive resin substrate which a polybenzasol fibers are arranged in a thick direction (Z direction) and in a direction inside the surface (X direction) according to the invention.

A heat conductive resin substrate which the polybenzasol fibers were oriented in the X direction of the resin substrate and was 2 mm in thickness as shown in FIG. 2 was prepared by laminating in a manner to justify fiber directions of prepregs made of the epoxy resin (material Zylon UD; made by Shinnittetu Kagaku Co., Ltd.) Which the polybenzasol fibers of the Embodiment 1 were impregnated 58 in volume percent to heat and press-form.

The volume resistivity, the thermal conductivity and a thermal expansion coefficient in each direction of the obtained heat conductive resin substrate were measured as in the Embodiment 1 and to show the result in Table 1.

Embodiment 3

Figure 4:
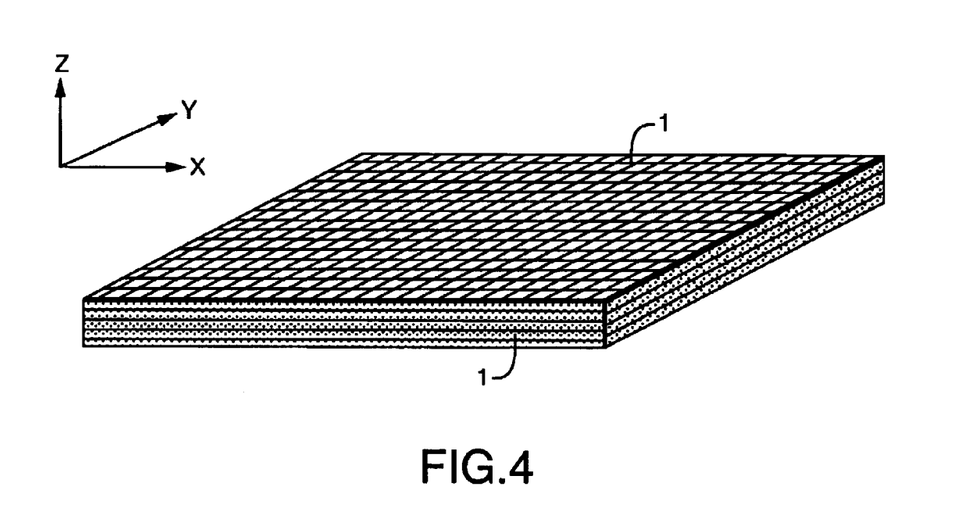
FIG. 4 is a schematic representation showing an example of a heat conductive resin substrate which the polybenzasol fibers are arranged in two directions the surface (X direction and Y direction) according to the invention.

A heat conductive resin substrate which the polybenzasol fibers were oriented in two directions (X direction and Y direction) of the surface as shown in FIG. 4 was prepared by laminating alternately in a manner to intersect at right angle the directions of the fibers of the prepregs made of the epoxy resin (material Zylon UD, made by Shinnittetu Kagaku Co., Ltd.) into which the polybenzasol fibers of the Embodiment 1 were impregnated 58 in volume percent to heat and press-form.

Volume resistivity of the obtained heat conductive resin substrate, thermal conductivity and a thermal expansion coefficients of each direction were measured as in the Embodiment 1 and to show the results in Table 1.

Embodiment 4

A block-like molded body was prepared by impregnate the thermosetting liquid state polyimide resin (52 in volume percent) into a three-dimensions woven fabric (the total fiber of 48 in volume percent) constituted by orienting the polybenzasol fibers (material Zylon HM filament; made by Toyoboseki Co., Ltd.) in the X direction, the Y direction and the Z direction by the same amount respectively to heat and press-form in vacuum.

Figure 5:
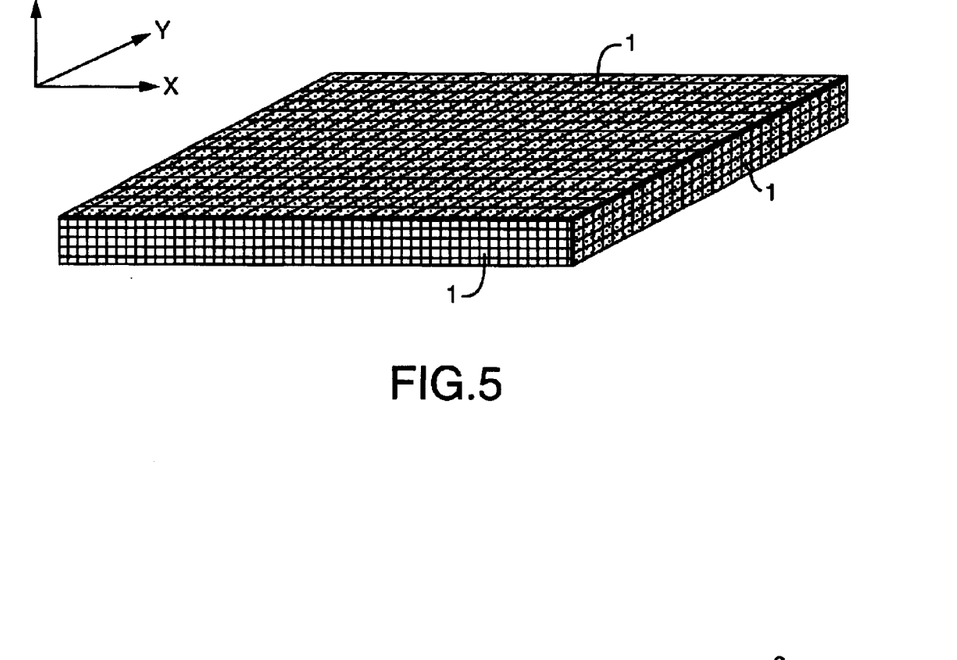
FIG. 5 is a schematic representation showing an example of a heat conductive resin substrate which the polybenzasol fibers are arranged in two directions (X direction and Y direction) and in the thick direction (Z direction) according to the invention.

A heat conductive resin substrate which the polybenzasol fibers were oriented in three directions of the Z direction and the X direction and the Y direction as shown in FIG. 5 was prepared by cutting the block-like molded body into 2 mm in thickness using an abrasive-type water jet cutting machine.

The volume resistivity of the obtained heat conductive resin substrate, the thermal conductivity and the thermal expansion coefficient in each direction were measured as in the Embodiment 1 to show the results in Table 1.

Embodiment 5

A block-like molded body was prepared by impregnate a thermosetting benzocyclobutene resin (52 in volume percent) into a three-dimensions woven fabric constituted such that the polybenzasol fibers (material Zylon UD; made by Toyaboseki Co., Ltd.) were oriented each 12 in volume percent in the X direction and the Y direction and 24 in volume percent in the Z direction (the thick direction) to heat and press-form in vacuum.

A heat conductive resin substrate which the polybenzasol fibers were oriented in three directions of the Z direction and the X direction and the Y direction as shown in FIG. 5 was prepared by cutting the block-like molded body into 2 mm in thickness using an abrasive-type water jet cutting machine.

The volume resistivity of the obtained heat conductive resin substrate, thermal conductivity and a thermal expansion coefficient in each direction were measured as in the Embodiment 1 to show the results in Table 1.

Comparative Example 1

The resin substrate consisting of only the epoxy resin used in the EMBODIMENT 1 was prepared to measure the volume resistivity, the thermal conductivity and the thermal expansion coefficient and to show the result in Table 1.

Comparative Example 2

The glass-cloth impregnated-epoxy resin substrate containing the glass-fiber cloth of 48 in volume percent was prepared to measure the volume resistivity, the thermal conductivity and the thermal expansion coefficient and to show the result in Table 1.

Embodiment 6

Figure 6:
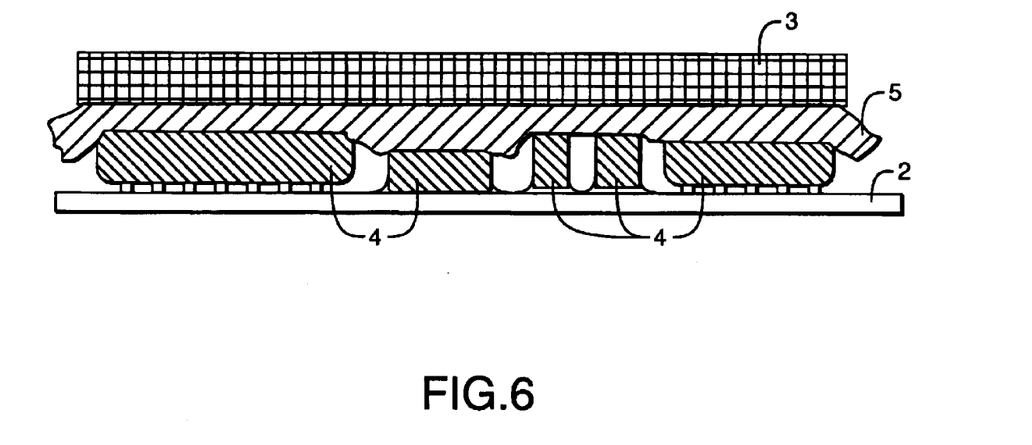
FIG. 6 is a schematic representation showing an example which the heat conductive resin substrate according to the invention is used in a printed circuit board 2 and a heat radiation element 3.

The electronic components 4 such as the semiconductor package were surface-packaged on a printed circuit board 2 constituted by laminating the copper film on the heat conductive resin substrate of the Embodiment 4 to form a wiring circuit, as shown in FIG. 6. Furthermore, an electronic equipment was prepared using the heat conductive resin substrate of the Embodiment 1 as the heat radiation element 3 via a heat conductive rubber sheet, and the electric power was supplied. As a result, it had been verified that heat radiation ability was excellent.

Embodiment 7

Figure 7:
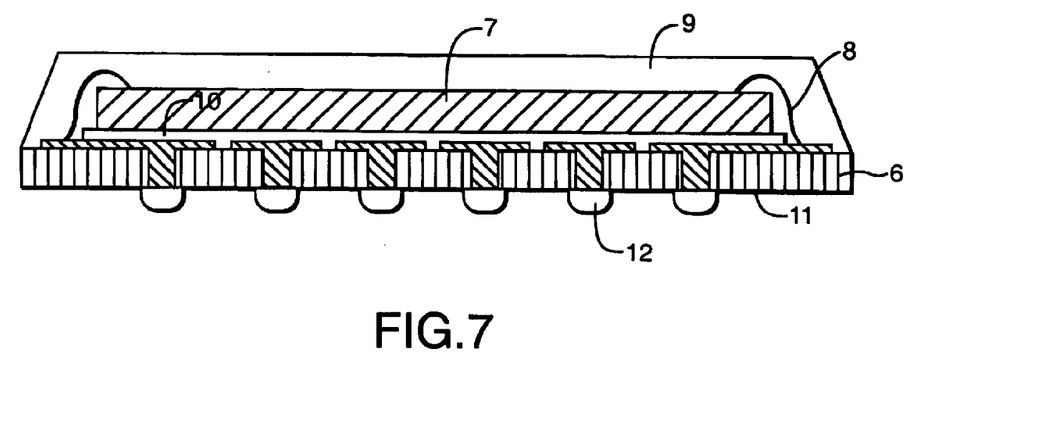
FIG. 7 is a cross section showing an example of a semiconductor package according to the invention.

The chip-sized package which the heat conductive resin substrate 6 of the EMBODIMENT 5 was used as the insulating substrate was prepared (FIG. 7). As a result of thermal and electrical reliability tests, malfunction phenomenons such as peeling-off between the materials and cracks in the chips, connecting materials and the resin or the like due to thermal stress had not been caused.

Embodiment 8

Figure 8:
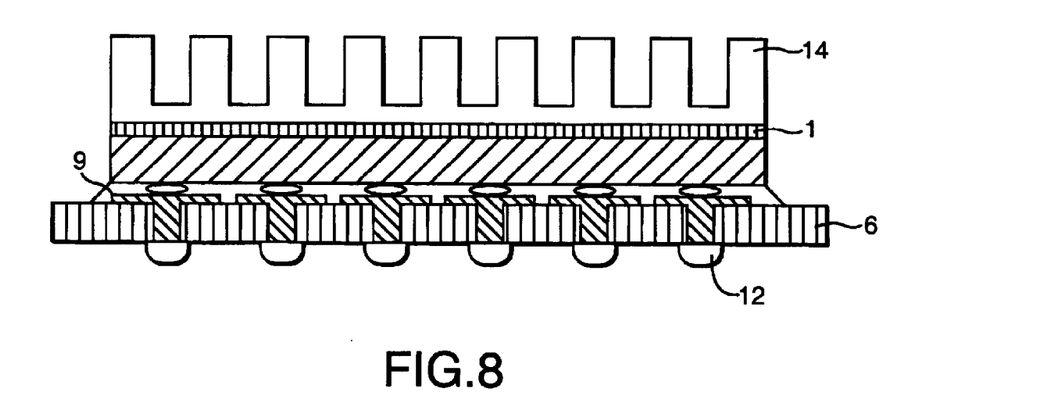
FIG. 8 is a cross section showing an example of the semiconductor package according to the invention.
Figure 9:
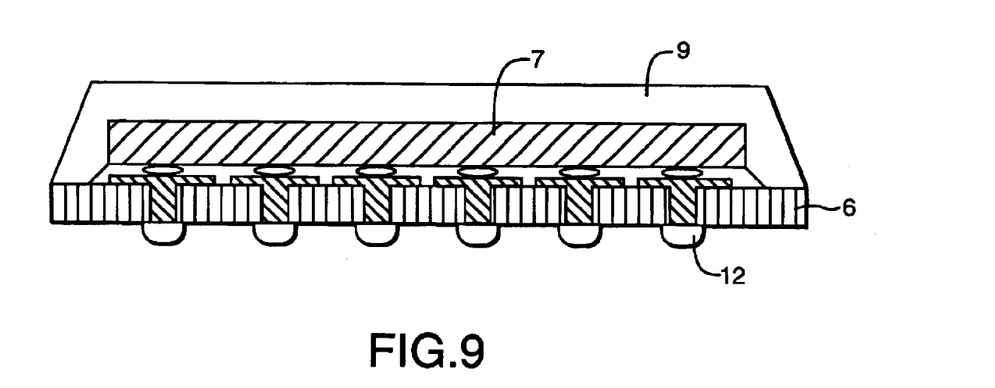
FIG. 9 is a cross section showing an example of the semiconductor package according to the invention.

A chip-sized package which the heat conductive resin substrate 6 of the EMBODIMENT 5 was used as the insulating substrate 6 and a heat conductive silicone rubber substrate, which the silicone rubber orienting the polybenzasol fibers in the thick direction (Z direction) is used as the matrix, was used as a heat-transferring member 13 was prepared (FIG. 8).

According to the results of thermal and electrical reliability tests, malfunction phenomenons such as peeling-off between the materials and the cracks in the chips, connecting materials and the resin or the like due to the thermal stress had not been caused.

Embodiment 9

A chip-sized package which a heat conductive bismaleimide resin was used as the insulating substrate 6 was prepared (FIG. 8), said heat conductive bismaleimide resin using the bismaleimide resin as the matrix, said the bismaleimide resin being constituted by orienting the polybenzasol fibers in the thick direction (the z direction) as the heat conductive resin substrate.

According to the results of thermal and electrical reliability tests, malfunction phenomenons such as peeling-off between the materials and the cracks in the chips, connecting materials and the resin or the like due to the thermal stress had not been caused.

Embodiment 10

Figure 10:
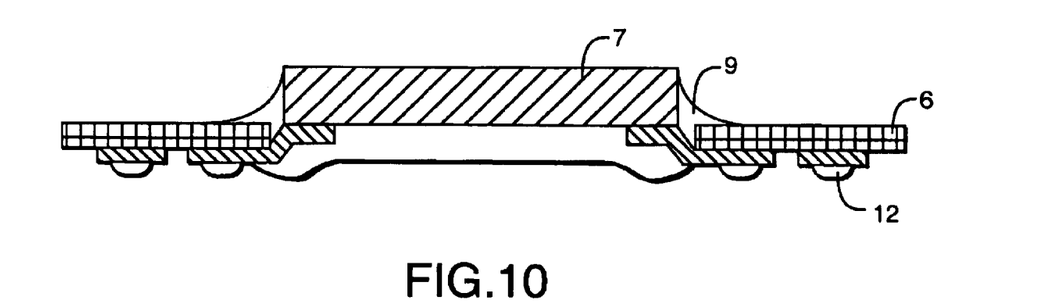
FIG. 10 is a cross section showing an example of the semiconductor package according to the invention.

A chip-sized package which the heat conductive resin substrate was used as the insulating substrate 6 was prepared (FIG. 10), said heat conductive resin substrate using a benzocyclobutene resin as the matrix, said benzocyclobutene resin being constituted by orienting the polybenzasol fibers in the thick direction (the Z direction) and in the direction of the surface (the X direction and the Y direction).

According to the results of thermal and electrical reliability tests, malfunction phenomenons such as peeling-off between the materials and the cracks in the chips, coninecting materials and the resin or the like due to the thermal stress had not been caused.

Embodiment 11

Figure 11:
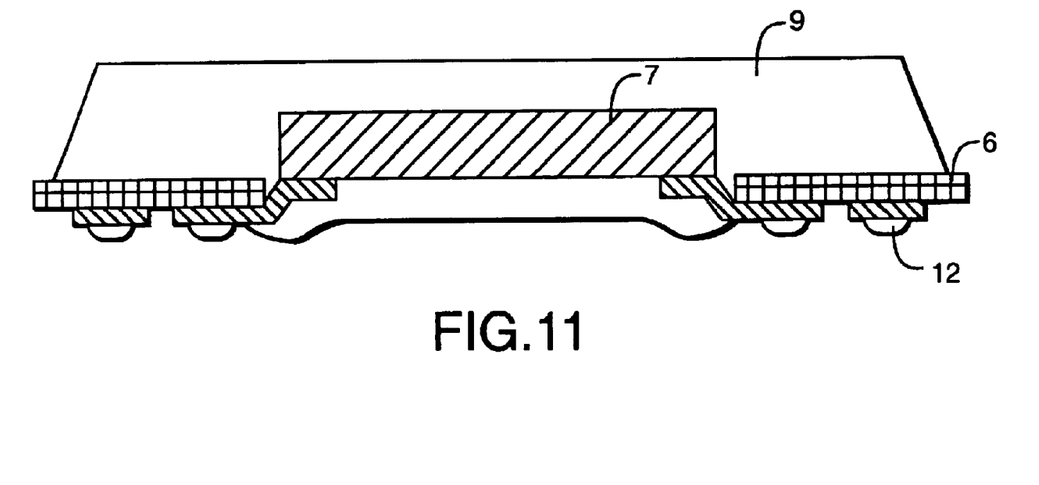
FIG. 11 is a cross section showing an example of the semiconductor package according to the invention.

A chip-sized package which a heat conductive fluoro resin was used as the insulating substrate 6 was prepared (FIG. 11), said heat conductive fluoro resin using a fluoro resin as the matrix, said fluoro resin being constituted by orienting the polybenzasol fibers in the thick direction (the Z direction).

According to the results of thermal and electrical reliability tests, malfunction phenomenons such as peeling-off between the materials and the cracks in the chips, connecting materials and the resin or the like due to the thermal stress had not been caused.

Embodiment 12

Figure 12:
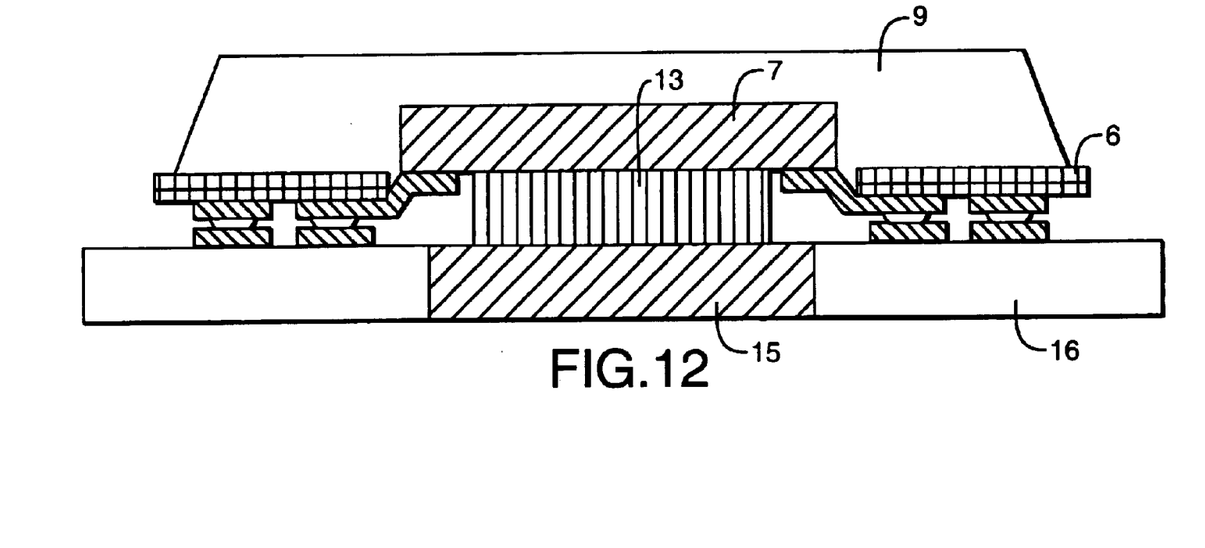
FIG. 12 is a schematic representation showing an example which the semiconductor package according to the invention is packaged on a printed circuit board 16.

A chip-sized package which a heat conductive polyphenylene ether resin was used as the insulating substrate 6 was prepared (FIG. 12), and was packaged on the printed circuit board 16, said heat conductive polyphenylene ether resin using the polyphenylene ether resin as the matrix, said polyphenylene ether resin being constituted by arranging the polybenzasol fibers in the thick direction (the Z direction) as the heat conductive resin substrate, said heat conductive polyphenylene other resin using a heat conductive silicone rubber substrate constituted by orienting the polybenzasol fibers in the thick direction (the Z direction) as the heat-transferring member 13.

According to the results of thermal and electrical reliability tests, malfunction phenomenons such as peeling-off between the materials and the cracks in the chips, connecting materials and the resin or the like due to the thermal stress had not been caused.

Table 1

According to Table 1, the Comparative EXAMPLE 1 of the resin substrate constituted by only the epoxy resin is small in thermal conductivity and large in a thermal expansion coefficient. The Comparative EXAMPLE 2 is the glass-cloth epoxy resin substrate used in the conventional printed circuit board, and although the thermal expansion coefficients of the direction of the surface of the X direction and the Y direction is small, it has been disadvantages that the thermal expansion coefficients of the thick direction (the Z direction) is large, and the thermal conductivity is small.

On the one hand, all the heat conductive resin substrate which the polybenzasol fibers are oriented in the thick direction (the Z direction) and/or the direction of the surface of the Embodiment 1 to the Embodiment 5 according to the invention are electrical insulation, and thermal conductivity of the direction which the polybenzasol fibers are arranged is large especially, and the thermal expansion coefficient can be controlled depending upon the direction which its fibers are oriented.

Effects of the Invention

The heat conductive resin substrate according to the invention is excellent in electrical insulation and good in heat conductivity, and the thermal expansion coefficient can be controlled, thereby being useful for a printed circuit board material in addition to a radiator, a radiating fin, a cooler, a heat sink, a heat spreader, a die pad and a casing or the like which high heat radiation ability and control performance of a thermal expansion coefficients are required.

Furthermore, a semiconductor package which the semiconductor chips are mounted on the heat conductive resin substrate orienting the polybenzasol fibers in the thick direction (the Z direction) and/or the direction of the surface of the resin substrate according to the invention has especially high heat radiation ability, and the control performance of the thermal expansion coefficients, thereby being very effective for usage which high reliability is required.

TABLE 1

|  | EMBODIMENT | | | | | COMPARATIVE | |
|---|---|---|---|---|---|---|---|
|  | 1 | 2 | 3 | 4 | 5 | 1 | 2 |
| SUBSTRATE (Vol. %) | | | | | | | |
| POLYBENZASOL FIBERS | 58 | 58 | 58 | 48 | 48 | | |
| GLASS-CLOTH | | | | | | | 48 |
| DIRECTION | Z | X | X, Y | X, Y, Z | Z | | X, Y |
| EPOXY RESIN | 42 | 42 | 42 | | | 100 | 52 |
| POLYIMIDE | | | | 52 | | | |
| BENZOCYCLOBUTENE RESIN | | | | | 52 | | |
| VOLUME RESISTIVITY | $4 \times 10^{15}$ | $4 \times 10^{15}$ | $4 \times 10^{15}$ | $7 \times 10^{15}$ | $2 \times 10^{15}$ | $4 \times 10^{15}$ | $3 \times 10^{15}$ |
| THERMAL CONDUCTIVITY COEFICIENCY | | | | | | | |
| X DIRECTION | 2.3 | 21 | 10 | 6.2 | 1.8 | 0.2 | 0.3 |
| Y DIRECTION | 2.4 | 3.1 | 2.9 | 6.3 | 1.7 | 0.2 | 0.3 |
| Z DIRECTION | 21 | 3.2 | 10 | 7.1 | 20 | 0.2 | 0.2 |
| THERMAL EXPANSION | | | | | | | |
| X DIRECTION | 62 | 10 | 19 | 12 | 65 | 74 | 14 |
| Y DIRECTION | 60 | 62 | 62 | 10 | 68 | 73 | 17 |
| Z DIRECTION | 9 | 66 | 18 | 11 | 14 | 75 | 50 |

What is claimed is:

1. A device comprising:

a substrate including a resin and polybenzasol fibers oriented in one of a thick direction and a surface direction of said substrate; and a semiconductor chip mounted on said substrate.

2. A device in accordance with claim 1, wherein:

a concentration of said polybenzasol fibers are oriented in a concentration of approximately 2–80 in volume percentages.

3. A device according to claim 1, wherein:

said resin includes one of an epoxy resin, a polyimide resin, a bysmaleymide resin, a benzocyclobutene resin, a silicone resin, a fluoro resin, and a polyphenylene ether resin.

4. The device according to claim 1, wherein:

a thermal conductivity in one direction is 4 W/mK or more.

5. A device in accordance with claim 1, wherein:

a concentration of said polybenzasol fibers are oriented in a concentration of approximately 2–80 in volume percentages;

said resin includes one of an epoxy resin, a polyimide resin, a bysmaleymide resin, a benzocyclobutene resin, a silicone resin, a fluoro resin, and a polyphenylene ether resin;

a thermal conductivity in one direction is 4 W/mK or more.

* * * * *